(12) United States Patent
Sheehan et al.

(10) Patent No.: US 7,566,752 B2
(45) Date of Patent: Jul. 28, 2009

(54) EPOXY RESINS OR POLYISOCYANATES REACTED WITH DERIVATIZED NOVOLAK POLYHYDROXYSTYRENE

(75) Inventors: Michael T. Sheehan, Corpus Christi, TX (US); Edward G. Zey, Corpus Christi, TX (US)

(73) Assignee: Du Pont Electronic Polymers L.P., Research Triangle Park, NC (US)

( * ) Notice: Subject to any disclaimer, the term of this patent is extended or adjusted under 35 U.S.C. 154(b) by 0 days.

(21) Appl. No.: 12/080,872

(22) Filed: Apr. 7, 2008

(65) Prior Publication Data

US 2008/0188619 A1    Aug. 7, 2008

Related U.S. Application Data

(62) Division of application No. 11/112,605, filed on Apr. 22, 2005, now Pat. No. 7,371,800.

(51) Int. Cl.
 C08F 8/08    (2006.01)
 C08L 25/18   (2006.01)
 C08L 63/00   (2006.01)
 C08F 12/04   (2006.01)
 C08L 75/04   (2006.01)

(52) U.S. Cl. .................. 525/118; 525/123; 525/124

(58) Field of Classification Search .......... None
See application file for complete search history.

(56) References Cited

U.S. PATENT DOCUMENTS

| | | | |
|---|---|---|---|
| 2,276,138 A | 3/1942 | Arden et al. | |
| 3,547,858 A | 12/1970 | Worrall | |
| 4,032,513 A | 6/1977 | Fujiwara et al. | |
| 4,544,704 A | 10/1985 | Hefner, Jr. et al. | |
| 4,678,843 A | 7/1987 | Elmore et al. | |
| 4,689,371 A | 8/1987 | Elmore et al. | |
| 4,822,862 A | 4/1989 | Rupp et al. | |
| 4,857,601 A | 8/1989 | Gupta | |
| 4,868,256 A | 9/1989 | Aslam et al. | |
| 4,877,843 A | 10/1989 | Gupta | |
| 4,898,916 A | 2/1990 | Gupta | |
| 4,912,173 A | 3/1990 | Keene et al. | |
| 4,962,147 A | 10/1990 | Vicari | |
| 4,965,400 A | 10/1990 | Vicari et al. | |
| 5,087,772 A | 2/1992 | Sheehan et al. | |
| 5,340,687 A | 8/1994 | Honda | |
| 5,554,719 A | 9/1996 | Sounik | |
| 5,565,544 A | 10/1996 | Sounik | |
| 7,371,800 B2 * | 5/2008 | Sheehan et al. | 525/390 |
| 2006/0099531 A1 * | 5/2006 | Sheehan et al. | 430/270.1 |
| 2008/0188692 A1 * | 8/2008 | Sheehan et al. | 568/720 |

FOREIGN PATENT DOCUMENTS

| | | |
|---|---|---|
| EP | 0-128-984 | 8/1983 |
| EP | 0-108-624 | 11/1983 |

OTHER PUBLICATIONS

U.S. Appl. No. 11/112,605, filed Apr. 22, 2005, Sheehan et al.

* cited by examiner

*Primary Examiner*—Robert Sellers
(74) *Attorney, Agent, or Firm*—James J. Mullen

(57) ABSTRACT

A process for preparing derivatized poly(4-hydroxystryrene) having a novolak type structure which comprises the steps of (i) supplying a solution of methanol containing 4-hydroxyphenylmethylcarbinol, (ii) subjecting said solution to an acid catalyzed displacement reaction for a sufficient period of time and under suitable conditions of temperature and pressure to convert substantially all of said carbinol to 4-hydroxyphenylmethylcarbinol methyl ether in solution, (iii) polymerizing said ether containing solution in the presence of a suitable acid catalyst for a sufficient period of time and under suitable conditions of temperature and pressure to form a novolak type polymer. New compositions of matter which comprise the derivatized poly(4-hydroxystyrene) prepared in the above manner and which have application in the electronic chemicals market such as in a photoresist composition, and in other areas such as in varnishes, printing inks, epoxy resins, copying paper, tackifiers for rubber, crude oil separators, and the like.

1 Claim, No Drawings

EPOXY RESINS OR POLYISOCYANATES REACTED WITH DERIVATIZED NOVOLAK POLYHYDROXYSTYRENE

RELATED PATENT APPLICATIONS

This patent application is a division of patent application Ser. No. 11/112,605, filed on Apr. 22, 2005 now U.S. Pat. No. 7,371,800.

BACKGROUND OF THE INVENTION

1. Field of the Invention

The present invention relates to a derivatized poly(4-hydroxystyrene) (DPHS) and a process for the production of DPHS indirectly from 4-hydroxymethyl-carbinol (HPMC) and which DPHS has a novolak type structure which has utility in the electronic chemicals market such as photoresist compositions. In addition to the use of DPHS in the microelectronic chemicals market, such DPHS can be employed in standard novolak applications such as varnishes, aniline printing inks, raw materials (e.g. curing agents) for epoxy resins, copying paper, tackifiers for rubber, crude oil separators, solder masks and photoimageable coverlays for rigid and flexible printed circuit boards, and further, derivatized epoxy resins and polyisocyanates which have been reacted with the hydroxy groups of the DPHS, such as paint formulations containing the same. The DPHS may also be used as a viscosity modifier for highly viscous polymers with the capability of crosslinking after casting and thus providing antioxidation protection therefore.

2. Description of the Prior Art

In the past, one of the ways of preparing poly(4-hydroxystyrene) (PHS) was the use of 4-hydroxystyrene (HSM) as the starting material; note European Patent Application No. 0-108-624. 4-Hydroxystyrene is a well-known compound in the art.

Although there are several known ways to prepare 4-hydroxystyrene, these known methods are not commercially feasible in the further utilization of the 4-hydroxystyrene. The 4-hydroxystyrene itself is difficult to isolate since it (1) readily decomposes, and (2) is toxic via skin absorption and, as a result, those skilled in the art have made numerous attempts at finding a method of synthesizing PHS in a manner which avoids using the 4-hydroxystyrene as the starting material.

The following prior art references are disclosed for informational purposes.

U.S. Pat. No. 5,087,772 (issued Feb. 11, 1992) discloses the preparation of HSM by reacting 4-acetoxystyrene (ASM) with a suitable alcohol in the presence of a catalytic amount of a suitable base.

U.S. Pat. No. 5,340,687 discloses the alkylation of a linear poly(4-hydroxystyrene).

European Patent Application No. 0-128-984 (publication no.) filed Aug. 30, 1983 discloses a process for the production of para-vinyl phenol (HSM) by dehydrogenation of para-ethyl phenol.

European Patent Application No. 0-108-624 (publication no.) filed Nov. 4, 1983, discloses a process for the production of p-vinyl phenol polymer (poly(4-hydroxystyrene) polymer —PHS) by polymerizing p-vinyl (HSM) in the presence of water and iron.

U.S. Pat. No. 4,032,513 (issued Jun. 28, 1977) discloses a process of producing PHS by cationically polymerizing HSM in the presence of a nitrile such as $CH_3CN$ using a cationic polymerization initiator in a homogeneous reaction system.

U.S. Pat. No. 5,554,719 and U.S. Pat. No. 5,565,544 disclose a process for preparing a branched PHS directly from HPMC which comprises the single step of polymerizing a mixture of carboxylic acid and at least one substituted phenyl carbinol such as HPMC.

However, it is highly desirable to have a linear DPHS and the prior art does not disclose this, much less a process for preparing the same.

Other prior art references which relate to the present invention include U.S. Pat. No. 2,276,138; U.S. Pat. No. 3,547,858, U.S. Pat. No. 4,544,704; U.S. Pat. No. 4,678,843; U.S. Pat. No. 4,689,371; U.S. Pat. No. 4,822,862; U.S. Pat. No. 4,857,601; U.S. Pat. No. 4,868,256; U.S. Pat. No. 4,877,843; U.S. Pat. No. 4,898,916; U.S. Pat. No. 4,912,173; U.S. Pat. No. 4,962,147; and U.S. Pat. No. 4,965,400.

All of the above-cited prior art and any other references mentioned herein are incorporated herein by reference in their entirety.

SUMMARY OF THE INVENTION

The present invention, in part, discloses a derivatized poly (4-hydroxystyrene) (DPHS) of the structural formula set forth herein and which DPHS is uniquely linear in character. Another aspect of the present invention is a process for preparing a derivatized poly(4-hydroxystyrene) (DPHS) having a novolak type structure which comprises the steps of (i) supplying a solution of methanol containing HPMC, (ii) subjecting said solution to an acid catalyzed displacement reaction for a sufficient period of time and under suitable conditions of temperature and pressure to convert substantially all of said HPMC to 4-hydroxyphenylmethylcarbinol methyl ether in said solution, and (iii) polymerizing said ether containing solution in the presence of a suitable acid catalyst for a sufficient period of time and under suitable conditions of temperature and pressure to form a novolak type polymer which is a unique and new DPHS polymeric material having a molecular weight of from about 1,000 to about 100,000, preferably from about 1,000 to about 50,000 and more preferably from about 1,000 to about 10,000. One of the most important characteristics of the DPHS is the fact that it is substantially linear (about 6% to about 40% weight percent) compared to the prior art PHS as determined by NMR, and has a low polydispersity, i.e. less than about 2.0.

DETAILED DESCRIPTION OF THE INVENTION

The present invention provides, in part, a derivatized poly (4-hydroxystyrene) (DPHS) having the following structure:

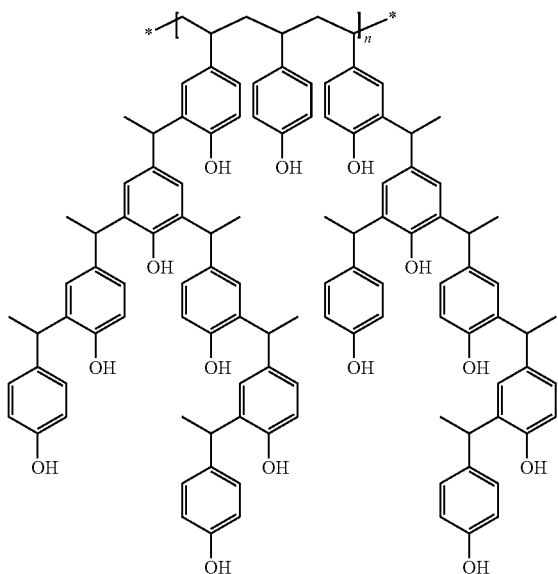

wherein n is from about 1 to about 10, and generally from about 2 to about 6.

The present invention provides a DPHS and a process for preparing PHS having a novolak type structure which comprises the steps of (i) supplying a solution of methanol containing 4-hydroxyphenylmethylcarbinol (HPMC), (ii) subjecting said solution to an acid catalyzed displacement reaction for a sufficient period of time and under suitable conditions of temperature and pressure to convert substantially all of said carbinol to 4-hydroxyphenylmethylcarbinol methyl ether in solution, and (iii) polymerizing said ether containing solution in the presence of a suitable acid catalyst for a sufficient period of time and under suitable conditions of temperature and pressure to form a novolak type polymer consisting of DPHS.

More specifically, the present invention is directed, in part, to a unique, cost-efficient process for preparing a novolak type polymer without any of the prior art disadvantages and wherein the polydispersity of the new material is surprisingly low, e.g. less than 2.0 and generally about 1.5 to about 1.9.

It has unexpectedly been found that the use of a freshly supplied carbinol such as HPMC cannot be used directly to form the a DPHS having a novolak type structure, and this is contrary to the disclosures set forth in U.S. Pat. No. 5,554,719 and U.S. Pat. No. 5,565,544. It has been found that if a freshly supplied carbinol such as HPMC is not treated as set forth in the present invention and before polymerization, the resultant polymer is a gummy mass which is poor in color and hard to further treat to arrive at the desired end product, i.e. the DPHS novolak type polymer. Thus, it is essential and critical that HPMC be converted to its ether form before the material is polymerized.

The carbinol such as HPMC is subject to an acid catalyzed displacement reaction in order to convert it to its methyl ether form. This step can be carried out by use of an acid ion exchange resin such as Amberlyst-15 (Rohm and Haas product) or M31 (Dow Product). The HPMC material is supplied in a methanol solvent wherein the HPMC is dissolved therein. The concentration of HPMC in solution is from about 1% to about 50% by weight, preferably from about 15% to about 30% by weight. This conversion takes place by merely contacting said HPMC containing methanol solution with, e.g. the A-15 material either by running the solution a fixed bed of A-15 or merely mixing the two materials together for a sufficient period of time and under suitable conditions of temperature and pressure. The temperature of the conversion step is not critical and can be from about 0 C to about 100° C. and the pressure is also not critical, but can be from about 0 psig to about 10 psig, or even conducted under vacuum. The conversion time is also not critical and is long as necessary to convert the HPMC to the methyl ether form. This time can be as long as several days at room temperature to as short as 24 hours at 45 C. The critical factor in this conversion step is the conversion must convert substantially all of the HPMC to the methyl ether form before the polymerization step takes place. It is desirable that the conversion be at least 90% complete, preferably at least 95% complete.

The second step is the polymerization step which is carried out with the same methanol solvent which now contains dissolved therein the methyl ether form of HPMC. This polymerization step is conducted with the use of a suitable acid catalyst under suitable conditions of temperature and pressure to form the desired end novolak product.

The catalyst employed in the present invention process is critical and is selected from the group $H_2SO_4$, HCl, $AlCl_3$, $H_3PO_4$, oxalic acid, 5 $nCl_2$, $BF_3$, $BBr_3$, $BCl_3$, para-toluene sulfonic acid, and methane sulfonic acid. Thus, Lewis acids and protic acids having a pKa of less than about 4.75 are suitable.

The catalyst is used in any amount in order to facilitate the reaction, i.e. polymerization, to yield the DPHS which has a novolak type structure. Such amounts generally are from about one part per million (ppm) to about 100,000 ppm, or higher.

The temperature employed in the polymerization is generally less than about 120° C., more specifically from about 0° C. to about 120° C. The reaction pressure may be subatmospheric, atmospheric, or superatmospheric.

The length of time which this polymerization step is conducted is not critical and the only requirement is that the polymerization be conducted for a period of time sufficient to form PHS having a novolak type structure. Generally, this period is at least five minutes and may be as long as 25 hours.

After the polymerization of the reaction mixture (i.e. acid catalyst+carbinol+any nucleating agent), the desired end product (DPHS) is recovered from the reaction product and the residual fraction containing any unreacted carbinol methyl ether can be recycled as part of the starting material for the next cycle. The end product (DPHS) may be recovered from the reaction product by any method; for example, it can be separated from the fraction containing the unreacted carbinol methyl ether by, e.g. precipitation in water followed by filtration, or any other suitable technique. For example, an electronic grade of DPHS can be produced containing low ppb metals by removal of the acid with a basic ion exchange resin followed by removal of the metals by acid ion exchange resin. It is also within the scope of the present invention to utilize a nucleating agent like a seed monomer in order to prepare the reaction mixture. Such material does not have to be a carbinol nor does it have to contain any hydroxy groups. Such nucleating agents may include, without limitation, the substituted phenols and substituted triarylalkyls, and other polyphenolics such as THPE.

It is also within the scope of the present invention to employ a chain terminating agent after the polymerization step. Any type of chain terminating agent may be used as long as there is no substantial adverse effect on the novolak structure of the DPHS formed.

It is also within the scope of the present invention that the DPHS may be recovered by other methods in the art such as by spray drying.

In addition to the use of DPHS (with a novolak-type structure) in the microelectronic chemicals market, such DPHS can be employed in standard novolak applications such as varnishes, aniline printing inks, raw materials for epoxy resins, copying paper, tackifiers for rubber, and crude oil separators and other applications as stated herein.

The following specific examples are supplied for the purpose of better illustrating the invention. These examples are not intended, however, to limit or restrict the scope of the invention in any way and should not be construed as providing conditions, parameters, or values which must be utilized exclusively in order to practice the present invention.

EXAMPLE 1

4-Hydroxyphenylmethylcarbinol Methyl Ether (HPME) Synthesis

To 15 gms of methanolic solution containing 22.2% 4-hydroxyphenylmethylcarbinol (HPMC) was added 0.45 gms of Amberlyst A-15 acid ion exchange resin. This mixture was allowed to stand for 72 hours at room temperature. HPLC analysis indicates that the resulting solution contains only 0.21% HPMC (99% conversion) with the remainder being HPME. This material thus produced is suitable for use as a raw material in the preparation of the DPHS polymer.

Polymerization of 4-Hydroxyphenylmethylcarbinol Methyl Ether (HPME), Production of DPHS Polymer in Methanol Solution To a 500 ml flask fitted with a nitrogen inlet, mixer, temperature indicator and controller, and reflux condenser was added 226 gms of methanol solution containing 30.4% HPME (68.7 gms HPME) raw material. Using solvent distillation 131 gms of methanol was removed rendering a solution containing 72.3% HPME in methanol.

The resulting solution was cooled to room temperature. With stirring and under nitrogen, 1.4 gms of aqueous 10% $H_2SO_4$ (catalyst) was added at 30° C. The mixture was heated over a 30 minute period to 35° C. and a second equal portion of catalyst was added. This process was repeated three more times at which time 7.0 gm of acid catalyst had been added with a resulting temperature of 50° C. over a two hour period. The polymerization mixture was then increased to 65° C., reflux temperature, at which time the mixture color was noted to be pink turning amber thereafter. Reflux was allowed to continue for 26 hours after which time the reaction mixture was cooled to 27° C.

The resulting reaction mixture was diluted with methanol to give a solids concentration of about 30% which was slowly fed into demineralized water (1 part by weight methanol solution to 10 parts demineralized water) to give a precipitated polymer product. The precipitated material was filtered and washed three times with 125 gms of fresh demineralized water.

The wet-cake thus obtained was dried under vacuum at 40° C. until the moisture content was about 1% or less. This polymer was observed to have a GPC molecular weight of 4528 MW, a polydispersity of 1.6, and was of light pink color.

EXAMPLE 2 COMPARATIVE

In a similar polymerization run using a raw material containing significant quantities of HPMC in the presence of HPME, a polymeric material completely unsatisfactory for commercial purposes was obtained. This undesirable material was dark blue in color and tacky upon vacuum drying. This material was also very difficult to filter and wash. This comparative example is similar to those examples 1-11 set forth in U.S. Pat. No. 5,554,719 and U.S. Pat. No. 5,565,544.

It is to be understood that the remarks above contain some theory as to the formation of DPHS with a novolak type structure; however, Applicant does not wish to be so limited.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. An resin material which has been further derivatized by reaction with the hydroxyl groups in the composition of matter having the following structure:

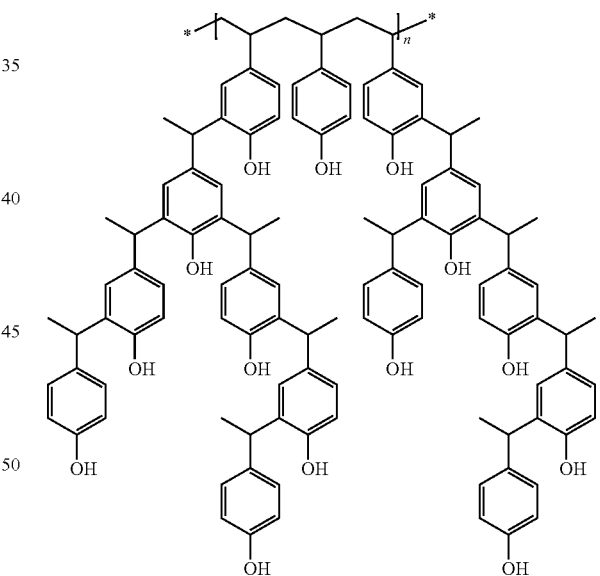

wherein n is from about 1 to about 10.

* * * * *